United States Patent
Pan et al.

(10) Patent No.: US 7,208,364 B2
(45) Date of Patent: Apr. 24, 2007

(54) METHODS OF FABRICATING HIGH VOLTAGE DEVICES

(75) Inventors: Shanjen Pan, Plano, TX (US); Sameer Pendharkar, Allen, TX (US); Pinghai Hao, Plano, TX (US); James R. Todd, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 42 days.

(21) Appl. No.: 11/154,431

(22) Filed: Jun. 16, 2005

(65) Prior Publication Data

US 2006/0286741 A1    Dec. 21, 2006

(51) Int. Cl.
*H01L 21/8238* (2006.01)
(52) U.S. Cl. ............... 438/199; 438/210; 438/224; 257/E27.05
(58) Field of Classification Search ........ 438/238–240, 438/250–256, 390–396, 199–234, 322–335
See application file for complete search history.

(56) References Cited

U.S. PATENT DOCUMENTS

| 4,290,077 | A | * | 9/1981 | Ronen ................. 257/409 |
| 6,168,983 | B1 | | 1/2001 | Rumennik et al. |
| 6,617,652 | B2 | | 9/2003 | Noda |
| 6,787,437 | B2 | | 9/2004 | Rumennik et al. |
| 6,797,594 | B2 | | 9/2004 | Hoshino et al. |
| 6,828,631 | B2 | | 12/2004 | Rumennik et al. |
| 2003/0107081 | A1 | * | 6/2003 | Lee et al. ............ 257/344 |
| 2003/0203512 | A1 | * | 10/2003 | Kweon ................. 438/3 |

* cited by examiner

*Primary Examiner*—H. Jey Tsai
(74) *Attorney, Agent, or Firm*—Peter K. McLarty; W. James Brady, III; Frederick J. Telecky, Jr.

(57) ABSTRACT

Methods of fabrication and devices include field plates formed during capacitor formation. Isolation structures are formed in a semiconductor substrate. Well regions are formed in the semiconductor substrate. Drain extension regions are formed in the well regions. A gate dielectric layer is formed over the device. A gate electrode layer is formed that serves as the gate electrode and a bottom capacitor plate. The gate electrode and the gate dielectric layer are patterned to form gate structures. Source and drain regions are formed within the well regions and the drain extension regions. A silicide blocking layer is formed that also serves as a capacitor dielectric. Field plates and a top capacitor plate are formed on the blocking layer.

12 Claims, 12 Drawing Sheets

METHODS OF FABRICATING HIGH VOLTAGE DEVICES

FIELD OF INVENTION

The present invention relates generally to semiconductor devices and more particularly to high voltage drain extended devices.

BACKGROUND OF THE INVENTION

Many integrated circuit devices include digital circuitry formed of metal-oxide-semiconductor (MOS) transistor devices, which are built using complementary MOS (CMOS) fabrication processes optimized for high-density, high-speed N-channel and P-channel MOS transistors. Such high-density circuitry is common in modern consumer electronic products such as wireless communications devices, portable computers, etc., in which digital circuitry is powered by batteries. In such products, it is generally desirable to provide a maximum amount of functionality in a limited amount of space, while keeping power consumption and cost to a minimum. To optimize circuit functionality, area, and power consumption, transistor sizes are often minimized and the transistors are designed to operate at low voltage levels. However, some electronic devices require transistor devices that operate at voltages substantially higher than that of logic or memory transistors. Such transistor devices are referred to as high voltage transistor devices and can be employed for power related tasks, such as power source switching.

One suitable type of high voltage transistor device is a drain-extended metal-oxide-semiconductor (DEMOS) transistor device using N or P channels. DEMOS devices advantageously combine short-channel operation with high current handling capabilities, relatively low drain-to-source on-state resistance (Rdson), and the ability to withstand relatively high drain-to-source voltages without suffering voltage breakdown failure, where DEMOS device designs often involve a tradeoff between breakdown voltage (BVdss) and Rdson. In addition to performance advantages, DEMOS device fabrication is relatively easy to integrate into CMOS process flows, facilitating use in devices where logic, low power analog, or other circuitry is also to be fabricated in a single integrated circuit (IC). These DEMOS devices employ an extended drain region having the same dopant type as the drain region. As a result of the extended drain region, the drain to source voltage for such devices is increased, at least partially according to a length of this extended drain region.

As stated above, it is generally desired to minimize or reduce area consumption for transistor devices. However, reducing area consumption for drain extended transistor devices can be at odds with providing a high enough operating voltage.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates fabrication and performance of drain extended transistor devices. Field plates are formed over a portion of a gate electrode and drain extension region that mitigates electric fields present there about. The field plates are formed using already existing fabrication processes used in the formation of capacitors on the device. The reduction of the electric fields at the drain corner improves device performance and maintains proper source to drain voltages and gate to drain voltages.

In accordance with one aspect of the invention, a method of fabricating a drain extended device is provided. Isolation structures are formed in a semiconductor substrate. Well regions are formed in the semiconductor substrate. Drain extension regions are formed in the well regions. A gate dielectric layer is formed over the device. A gate electrode layer is formed that serves as the gate electrode and a bottom capacitor plate. The gate electrode and the gate dielectric layer are patterned to form gate structures. Source and drain regions are formed within the well regions and the drain extension regions. A silicide blocking layer is formed that also serves as a capacitor dielectric. Field plates and a top capacitor plate are formed on the blocking layer.

BRIEF DESCRIPTION OF THE DRAWINGS

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
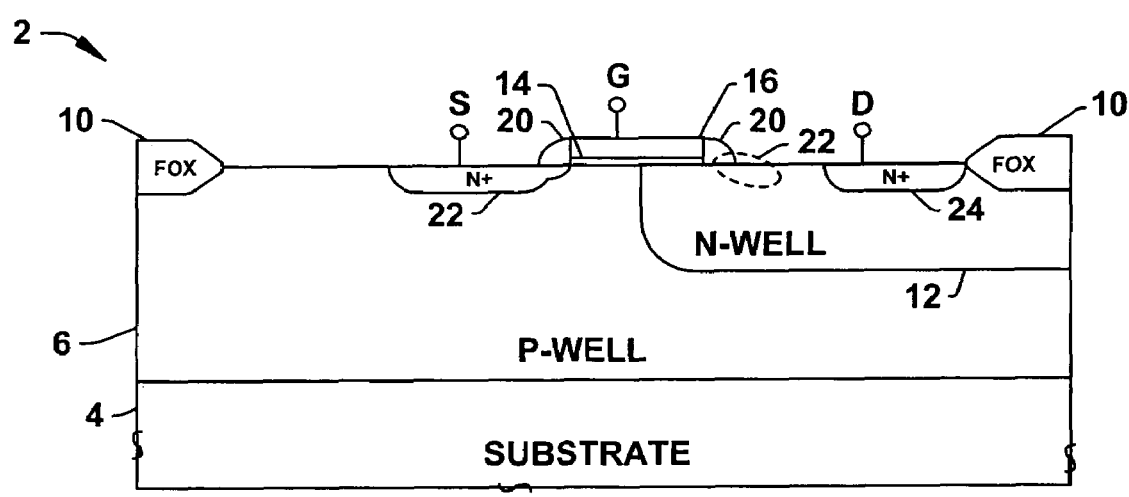
FIG. 1 is a cross sectional view of a conventional NMOS DEMOS device.

One or more implementations of the present invention will now be described with reference to the attached drawings, wherein like reference numerals are used to refer to like elements throughout, and wherein the illustrated structures are not necessarily drawn to scale.

The scale of drain extended transistor devices continues to shrink. As a result, electric fields near edges of gate structures near drain regions, also referred to as drain corners, continue to increase. These increased electric fields result in undesired charge injection and hamper device operation. As a result, scaling of conventional drain extended transistor devices is limited.

The present invention facilitates fabrication and performance of drain extended transistor devices. Field plates are formed over a portion of a gate electrode and drain extension region that mitigates electric fields present there about. The field plates are formed using already existing fabrication processes used in the formation of capacitors on the device. The reduction of the electric fields at the drain corner improves device performance and maintains proper source to drain voltages and gate to drain voltages.

FIG. 1 is a cross sectional view of a conventional NMOS DEMOS device 2. The device 2 is illustrated as an NMOS device to more clearly illustrate the conventional DEMOS devices.

Isolation regions 10 are formed on a semiconductor substrate or body 4 and a p-well 6 is formed within the semiconductor substrate 4. The isolations regions 10 can be local oxidation structures (LOCOS), shallow trench isolation regions (STI), or another suitable integrated circuit isolation scheme. The p-well 6 can be formed by implanting a p-type dopant, such as Boron, with a relatively low concentration and dose and a relatively high energy. Alternately, the p-well 6 can be formed by selecting the semiconductor substrate 4 such that it comprises p-type doping of a sufficient concentration. The semiconductor substrate 4 is comprised of a semiconductor material, such as silicon or silicon-germanium, and may be doped or un-doped.

A drain extension region 12 is formed within the p-well that increases the drain to source operational voltage and provides the properties of DEMOS transistors. The drain extension region 12 is formed by implanting n-type dopants, such as phosphorous, with relatively low energy and dose to form the region as begin relatively shallow and lightly doped. The drain extension region 12 may also be referred to as a lightly doped drain.

A source region 22 is formed within the p-well and a drain region 24 is formed within the drain extension region 12 also defining a channel region there between. The source region 22 and the drain region 24 are formed by implanting n-type dopants with a higher dose and lower energy than that employed in forming the drain extension region 12.

A gate dielectric layer 14 is formed on the substrate 4 around the channel region and a gate layer 16 is formed on the gate dielectric layer 14. The gate dielectric layer 14 has a first equivalent oxide thickness (e.g., 75 Angstrom) that at least partly defines a maximum first gate voltage that can be employed for the transistor device 2. The gate layer 16 is comprised of a conductive material, such as polysilicon, doped or undoped. Sidewall spacers 20 are formed on lateral edges of the gate layers by, for example, depositing an insulative spacer material, such as oxide, and anisotropically etching the deposited later thereby forming the spacers 20.

The inventors of the present invention have identified that performance of DEMOS devices can be degraded due to increased electric fields generated at drain corners 24 of gate structures. The increased electric fields are present due to shrinking area consumption and device dimensions. As a result, charge can be injected into the drain corners thereby degrading device performance.

Figure 2:
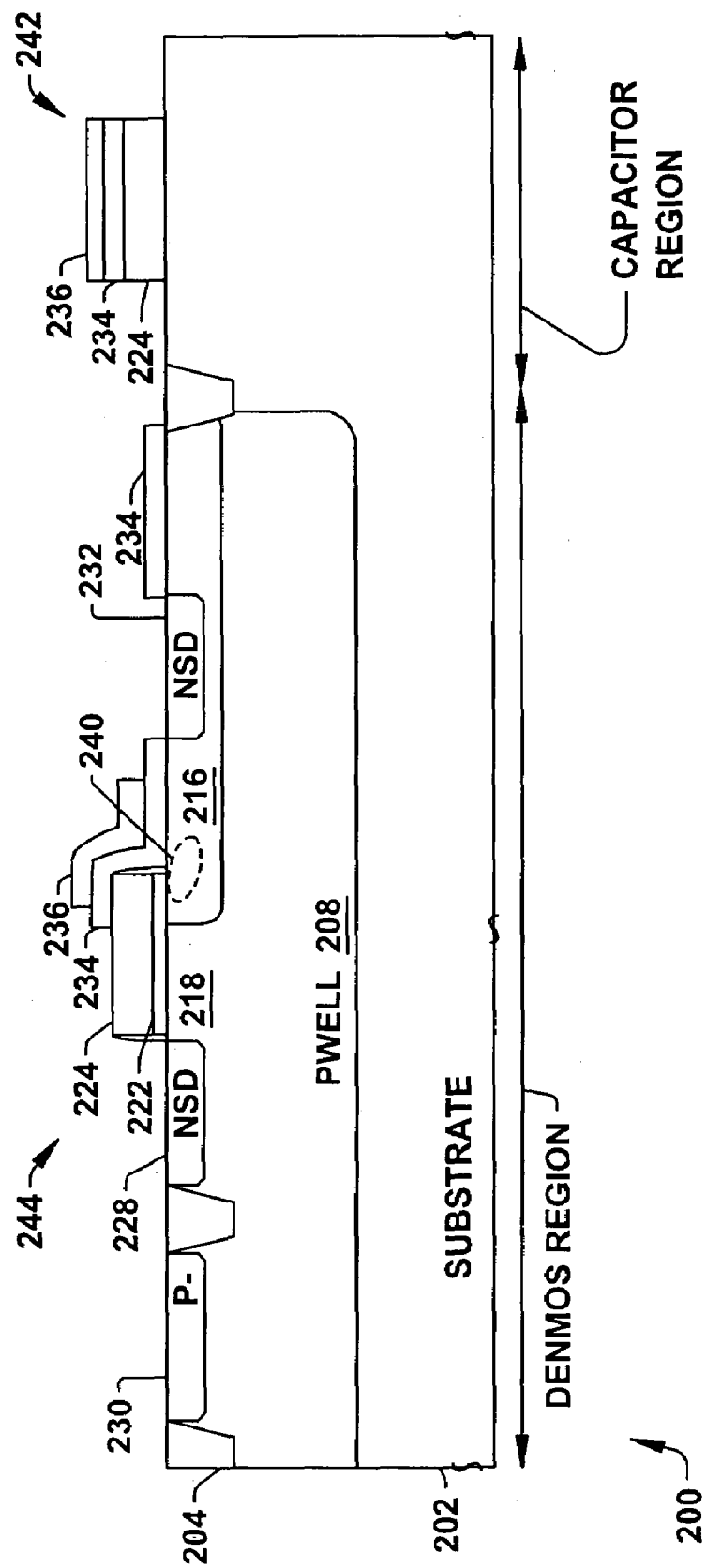
FIG. 2 is a cross sectional view of a portion of a drain extended semiconductor device in accordance with an aspect of the present invention.

FIG. 2 is a cross sectional view of a portion of a drain extended semiconductor device 200 in accordance with an aspect of the present invention. The device 200 is shown with a drain extended NMOS (DENMOS) transistor device and a capacitor 242. The DENMOS device is formed with a field plate 236 that mitigates electric field concentration at a drain corner 240.

The device 200 includes a DENMOS region, a capacitor region, and a drain extended PMOS region (not shown). Isolation structures 204 are formed within and/or on a semiconductor substrate or body 202. The isolation structures can be local oxidation structures (LOCOS), shallow trench isolation regions (STI), or another suitable integrated circuit isolation scheme. The semiconductor substrate 202 is comprised of a semiconductor material, such as silicon. A p-type well region 208 is formed within the semiconductor substrate 202. The p-type well region 208 is formed by implanting a suitable p-type dopant, such as boron. A drain extension region 216 is formed within the p-type well region 208 by implanting a suitable n-type dopant, such as phosphorous, arsenic, or antimony. A source region 228 is formed within the p-well region 208 as shown in FIG. 2 by selectively implanting an n-type dopant. A back gate region 230 is formed within the p-well region 208 by selectively implanting a p-type dopant. A drain region 232 is formed within the drain extension region 216 by also implanting an n-type dopant.

A gate dielectric layer 222 and a conductive layer 224 form a gate structure 244. The gate dielectric layer 222 is comprised of a dielectric material such as silicon dioxide. The conductive layer 224, also serves as a gate electrode, and is comprised of a conductive material, such as polysilicon. Additionally, the conductive layer 224 serves as a bottom capacitor plate within the capacitor region. A dielectric/insulative layer 234 is formed over the drain extension region 216 and covers a portion of the gate structure 244. The layer 234 within the DENMOS region serves as a silicide blocking layer to prevent undesired silicide formation on the drain extension region. The layer 234 is also formed on the conductive layer 224 within the capacitor region and serves as a capacitor dielectric layer.

A metal layer 236 is selectively formed on the layer 234 by depositing and/or forming metal material, such as TaN and/or TiN. The metal layer 236 serves as a field plate within the DENMOS region and serves as a top capacitor plate within the capacitor region. The field plate 236 within the DENMOS region mitigates electric field formation near a drain corner 240.

By employing the same conductive layer 236 for formation of capacitor plates and field plates, the device 200 can be fabricated without requiring additional fabrication steps or processes. The field plates can be formed by employing already present fabrication processes for forming the capacitor plates.

It is noted that the present invention includes devices and methods of fabrication that include multiple DENMOS transistors, multiple DEPMOS transistors, and multiple capacitors. FIG. 2 depicts a single DENMOS transistor and single capacitor in order to further illustrate the present invention.

Figure 3:
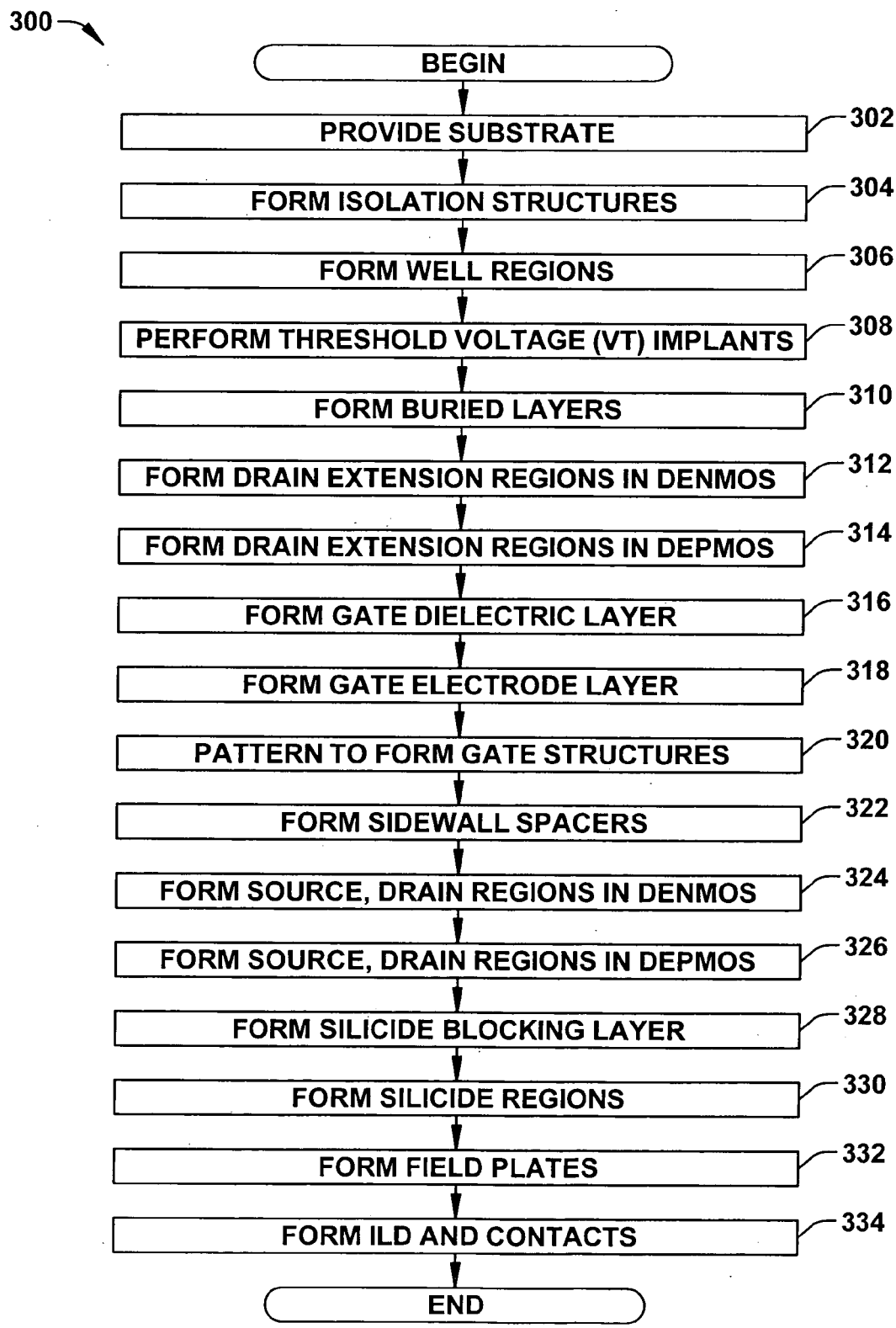
FIG. 3 is a flow diagram illustrating a method of fabricating a drain extended transistor in accordance with an aspect of the present invention.

FIG. 3 is a flow diagram illustrating a method 300 of fabricating a drain extended transistor in accordance with an aspect of the present invention. The method 300 forms a field plate that mitigates increased electric fields at drain corners by employing already occurring capacitor fabrication processes. As a result, the field plate can be formed without additional processing being required.

The method 300 begins at block 302, wherein a semiconductor substrate or body is provided. The semiconductor substrate is comprised of a semiconductor material such as silicon. The semiconductor substrate or body is typically a wafer and may be doped or undoped.

Isolation structures are formed on the substrate at block 304. The isolation structures serve to electrically isolate individual transistors on the device and to separate and define various regions of the device. The isolation structures define a DENMOS region, a DEPMOS region, and a capacitor region. Within the DENMOS region and the DEPMOS region, the isolation structures also define active regions, wherein source regions, gates, and drain regions are formed, and back gate regions. The isolation structures can be local oxidation structures (LOCOS), shallow trench isolation regions (STI), or another suitable integrated circuit isolation scheme. LOCOS structures are formed by first depositing oxide and nitride films, which are then patterned and etched to expose areas in the substrate where the isolation structure is required. The substrate is then oxidized to form the isolation structures. STI structures are formed by first etching a trench in the substrate, which is then filled with an insulator comprised of an insulative material, such as, silicon oxide, silicon nitride, and the like.

N-type well regions and p-type well regions are formed in the DENMOS and DEPMOS regions at block 306. The p-type well regions are formed within the active and back gate regions of the DENMOS region and the n-type well regions are formed within the active and back gate regions of the DEPMOS region. Implanting n-type and p-type dopant species into the substrate forms the n-type and p-type well regions, respectively. It is noted that the semiconductor substrate can be selected to be doped p-type, thereby allowing p-type well formation to be avoided.

N-type and p-type threshold voltage implants are performed at block 308, for setting the transistor threshold voltages. A resist mask can be employed to cover the drain extension regions during the threshold voltage implants. Other implants, such as n-type and p-type punch through implants, n-type and p-type channel stop implants, n-type and p-type pocket implants can optionally be performed here or at a later time in the method 300. The punch through implants can reduce transistor off current. The channel stop implants can reduce isolation leakage. The pocket implants are can mitigate threshold voltage roll-off. One or more anneals are typically performed to repair damage to surfaces of the device resulting from the threshold voltage and/or other implant implants.

P-type and n-type buried layer are formed at block 310 in active regions of the device. For an NMOS region, the buried layer is formed by implanting p-type dopant(s) with a relatively high energy. For a PMOS region, the buried layer is formed by implanting n-type dopant(s) with a relatively high energy.

Lightly doped n-type drain extension regions are formed within the p-well regions (NMOS) at block 312. The lightly doped n-type regions are doped with a dopant concentration substantially less than that of later formed source and drain regions and the dopant concentration is selected such that it will deplete when the drain voltage increases. The drain extension regions are formed with a lower energy than that of the buried layer implants of block 310.

Lightly doped p-type drain extension regions are formed within the n-well regions at block 314. The lightly doped p-type regions are doped with a dopant concentration substantially less than that of later formed source and drain regions and the dopant concentration is selected such that it will deplete when the drain voltage increases. The p-type drain extension regions are formed with a lower energy than that of the buried layer implants of block 310.

A gate dielectric layer is formed over the device at block 316. The gate dielectric layer is comprised of a dielectric material, such as, oxide, thermally grown oxide, a nitride, an oxynitride, and the like. The gate dielectric layer is formed having a suitable thickness that permits a relatively high threshold voltage to be employed.

A gate electrode layer is then formed on the gate dielectric layer at block 318 within the DEPMOS and DENMOS regions and a bottom capacitor plate is formed over the substrate within a capacitor region. The gate electrode layer and bottom plate are formed depositing or forming a layer of conductive material. Some suitable conductive materials include, but are not limited to, polycrystalline silicon ("poly" or "polysilicon"), epitaxial silicon, metal materials, and the like. An n-type dopant can optionally be implanted within the gate electrode layer within the NMOS region. This is frequently done for electrode layers comprised of polysilicon. A resist mask that covers the PMOS region and exposes the NMOS region is typically employed to implant the n-type dopant only within the NMOS region.

The gate dielectric layer and the gate electrode layer are then patterned at block 320 to form gate structures, which can also serve as alignment structures for later fabrication processes. A resist mask is employed to cover desired gate structure locations and to expose the gate electrode layer elsewhere. Then, an etch process is performed that removes the exposed portions of the gate electrode layer and the gate dielectric layer. The etch process may include one or more individual etch processes comprising different chemistries for different materials and stages of etching. For example, a different etch chemistry selective to silicon dioxide may be employed for the gate dielectric layer and another etch chemistry selective to polysilicon for the gate electrode layer.

Sidewall spacers are formed on lateral edges of the gate structures at block 322. Sidewall spacer material, including silicon dioxide, silicon nitride, and the like, is blanket deposited and then etched anisotropically to form the sidewall spacers.

Source regions are formed within the p-well regions, drain regions are formed within the n-type lightly doped drain extension regions, and back gate regions are formed within the p-well regions within the DENMOS region at block 324. N-type dopants, such as phosphorous or arsenic, are implanted using a mask and the gate structures as alignment structures. The drain region formed is more n-type than the surrounding lightly doped drain extension region.

Source regions are formed within the n-well regions, drain regions are formed within the p-type lightly doped drain extension regions, and back gate regions are formed within the n-well regions within the DEPMOS region at block 326. P-type dopants, such as Boron (B) and $BF_2$, are implanted using a mask and the gate structures as alignment structures. The drain region formed is more p-type than the surrounding lightly doped drain extension region. A thermal process, such as a rapid thermal anneal or source/drain anneal is typically performed afterwards. The thermal process activates implanted dopants, particularly within the source/drain regions.

A silicide blocking layer is formed over the drain extension regions at block 328 within the DENMOS and DEPMOS regions. The blocking layer, however, does not cover the drain region formed within the drain extension region. The blocking layer does cover a portion of the gate structure. The blocking layer is typically comprised of silicon dioxide, but may also comprise other dielectric materials. As an example, a silicon dioxide deposition process may be employed to form a blocking layer comprised of silicon dioxide. A resist mask that exposes the drain extension regions is typically employed to allow selective formation of the blocking layer. Additionally, a capacitor dielectric layer is formed within the capacitor region at block 328 as the blocking layer is formed.

Silicide regions are then formed on the source regions, the drain regions, the gate structures, and back gate structures at block 330. The silicide regions can be comprised of cobalt (Co), titanium (Ti), and the like. Generally, the silicide regions are formed by applying a mask and sputtering a silicide material (e.g., Co, Ti, and the like) onto the gate electrode layer. A silicide process is then performed causing the silicide material to react with underlying material (e.g., silicon) thereby forming silicide regions. Additionally, a thermal process or anneal is typically performed. The silicide regions generally provide a lower contact resistance to the first gate layer.

Field plates are selectively formed over a portion of the gate structures and the drain extension regions and on the blocking layer within the DENMOS and DEPMOS regions and top capacitor plates are simultaneously formed within the capacitor region at block 332. The field plates and capacitor plates are formed simultaneously via a common deposition/formation process. The field plates are formed by selectively forming a metal material, such as TaN or TiN on the blocking layer over the portion of the gate structures and the drain extension regions. The capacitor plates are formed by selectively forming the metal material in selected locations. The metal material can be deposited or formed by a suitable process, such as electroless deposition, electro-based deposition, sputtering, and the like.

The field plates mitigate electric field formation near drain corners and, as a result, improve performance of the transistor devices. One characteristic that is significant is the distance from an outer edge of the drain regions to an edge of the field plates. This distance is typically selected according to desired performance and reliability.

Subsequently, interlayer dielectric layers or other insulative layers are formed and contacts are selectively formed therein at block 334. Contacts are formed to the gate structures, the back gate regions, the source regions, and the drain regions. Generally, a dielectric layer is deposited over the device followed by a planarization process. Thereafter, vias are selectively formed in the interlayer dielectric layer and subsequently filled with a conductive material.

Other layers, including protective layers and metallization layers, can then be performed to complete fabrication of the device.

Figure 4A:
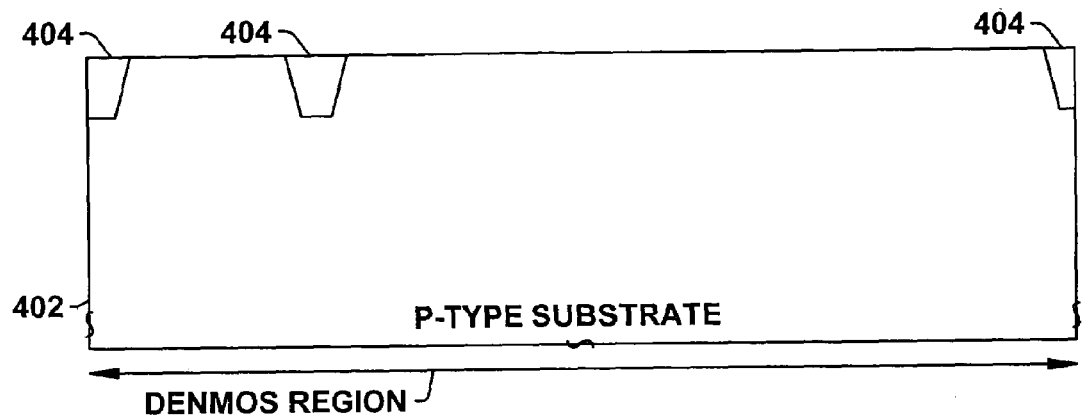
FIGS. 4A to 4P depict various stages of fabrication for a drain extended transistor device with a field plate formed in accordance with the method of FIG. 3.
Figure 4B:
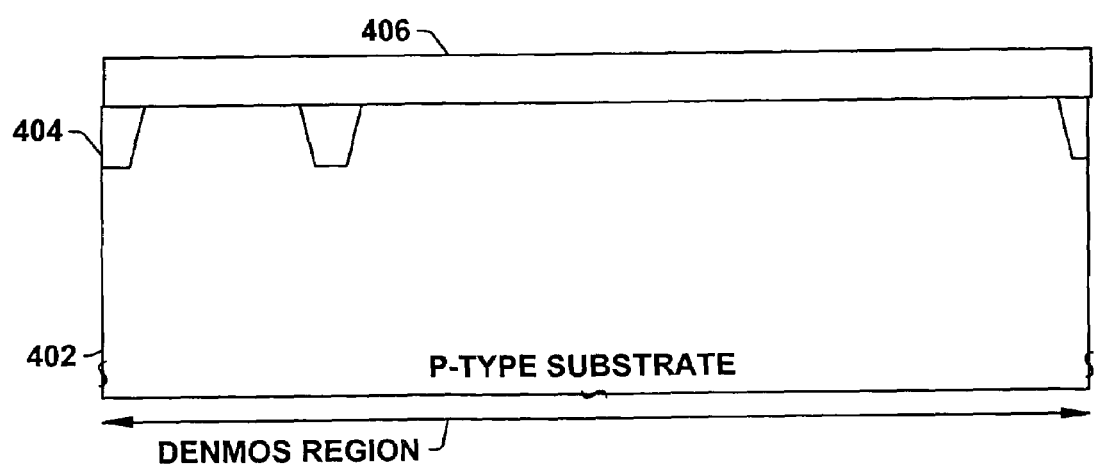
Figure 4C:
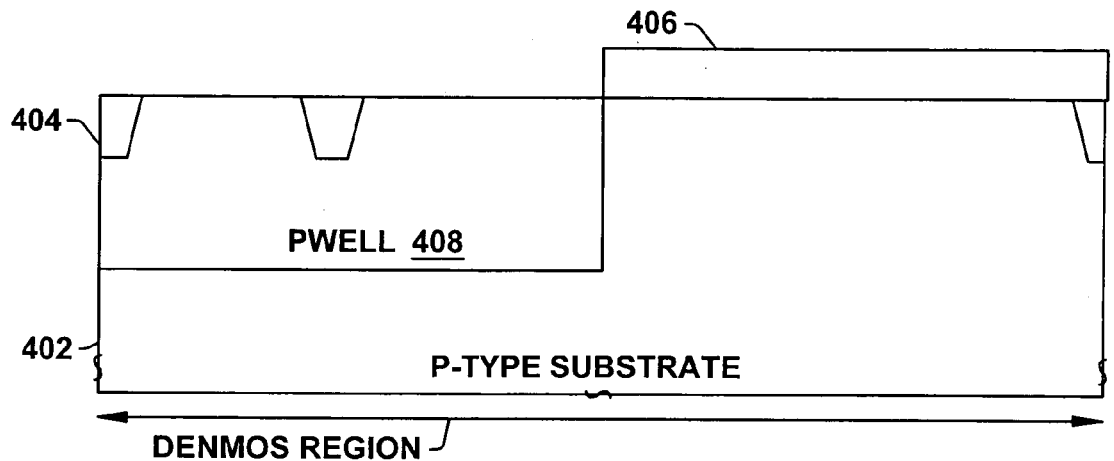
Figure 4D:
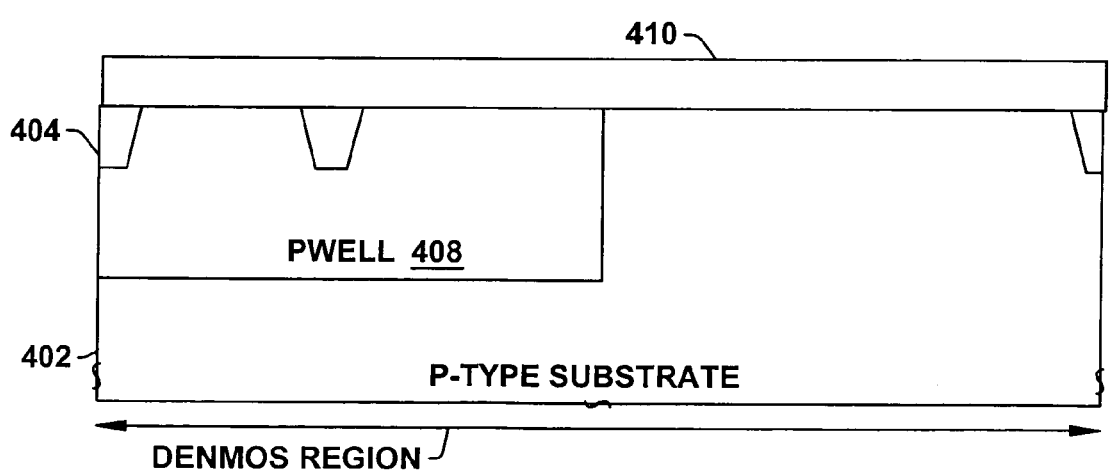
Figure 4E:
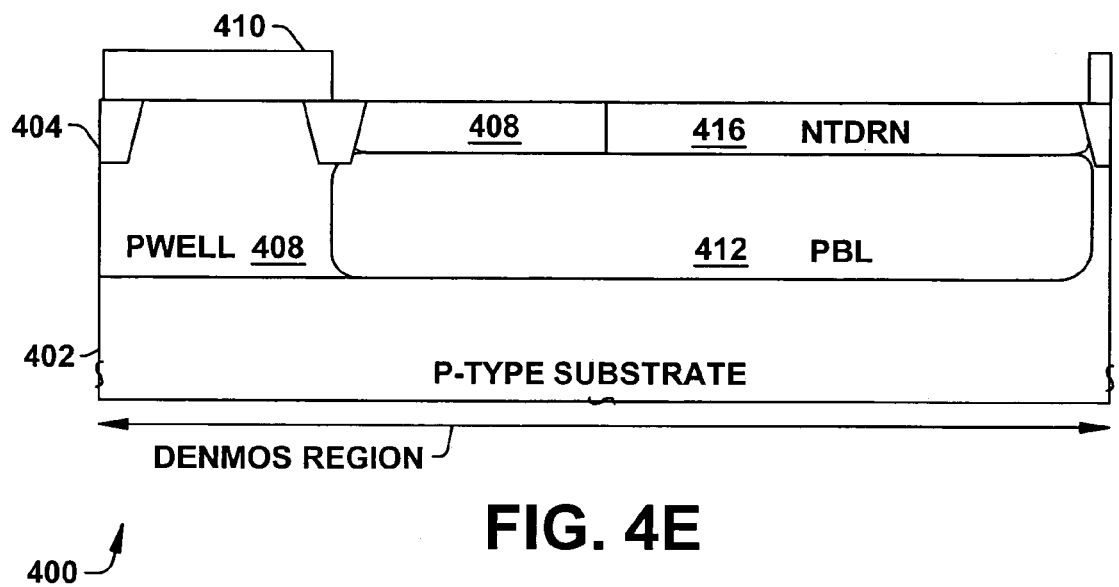
Figure 4F:
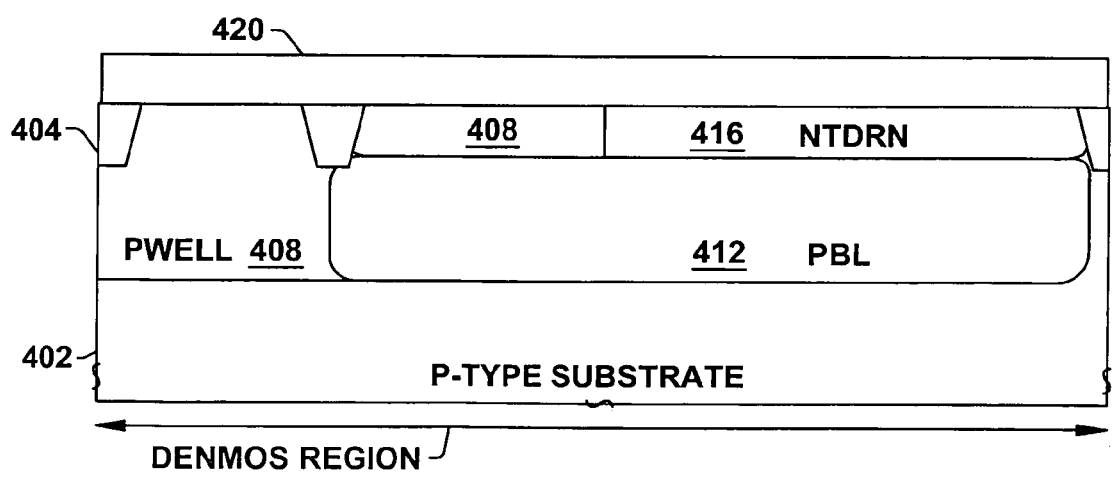
Figure 4G:
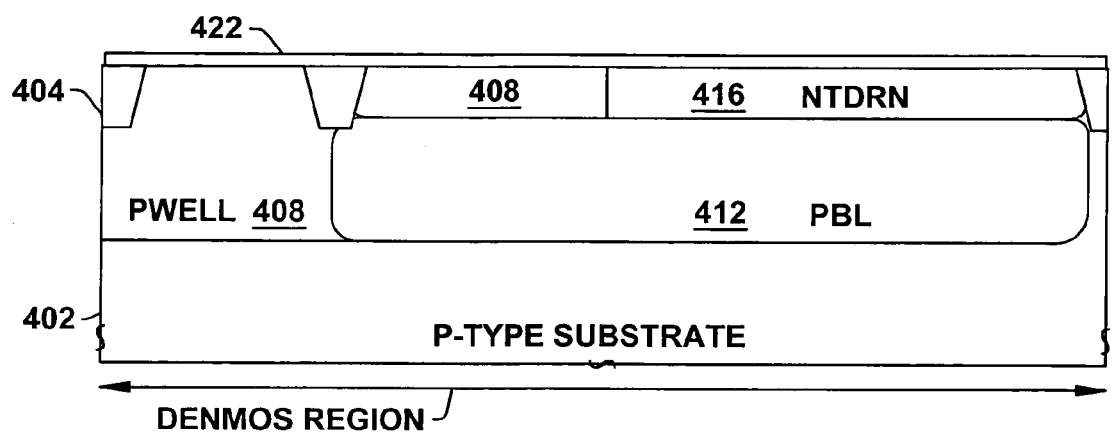
Figure 4H:
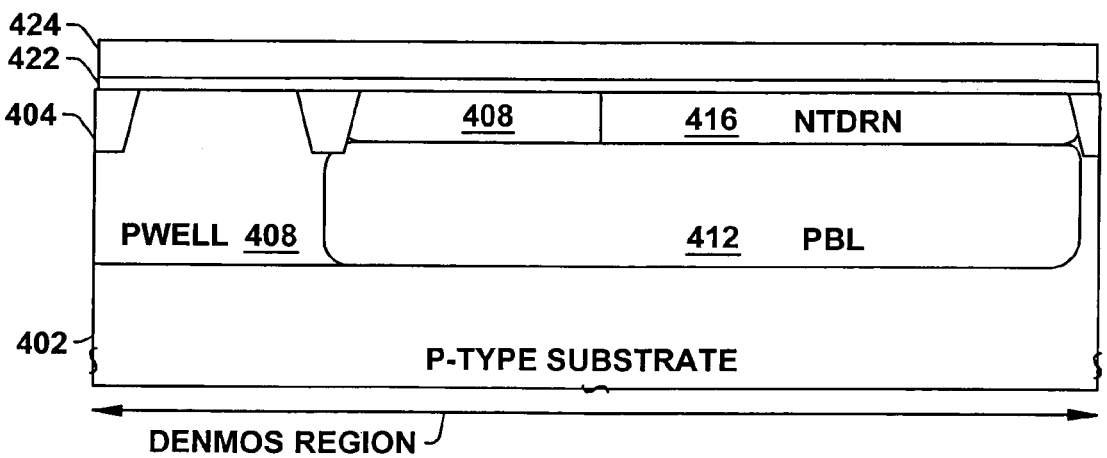
Figure 4I:
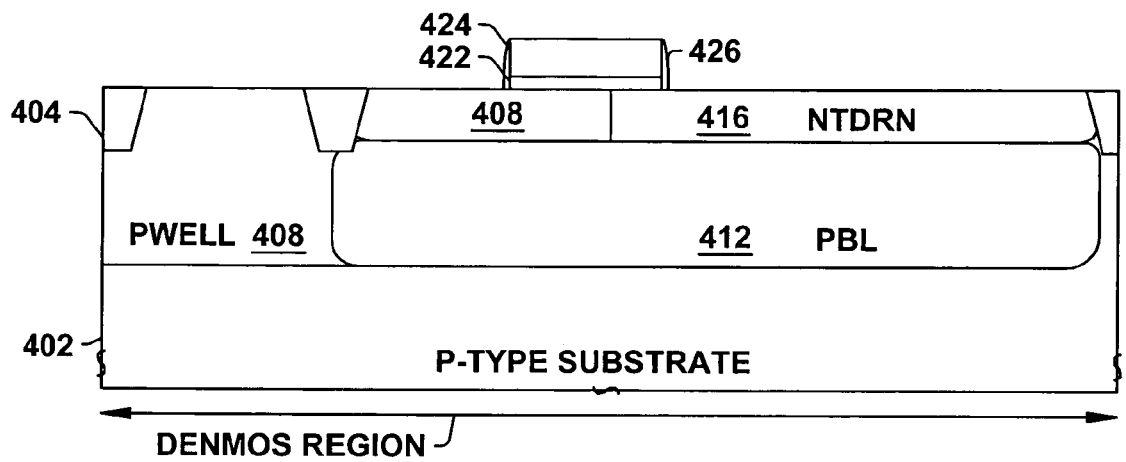
Figure 4J:
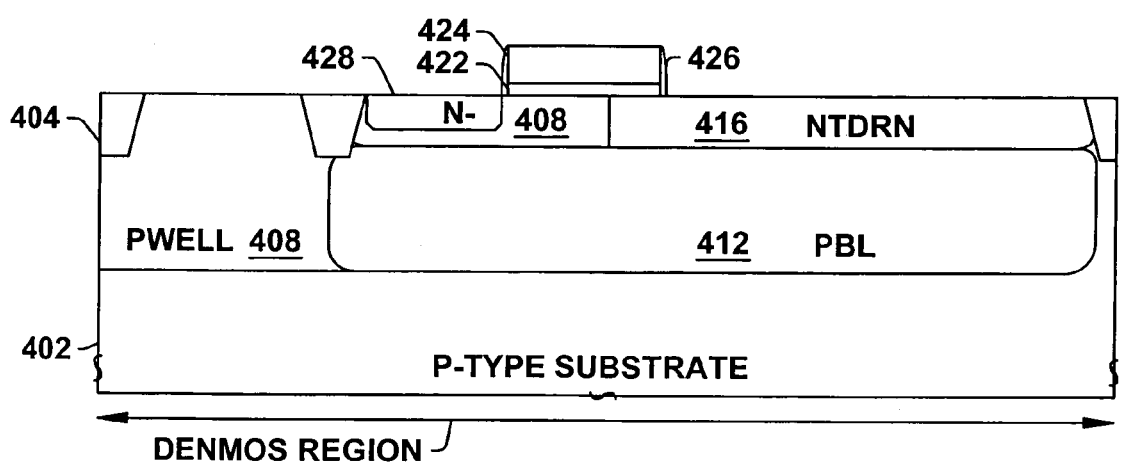
Figure 4K:
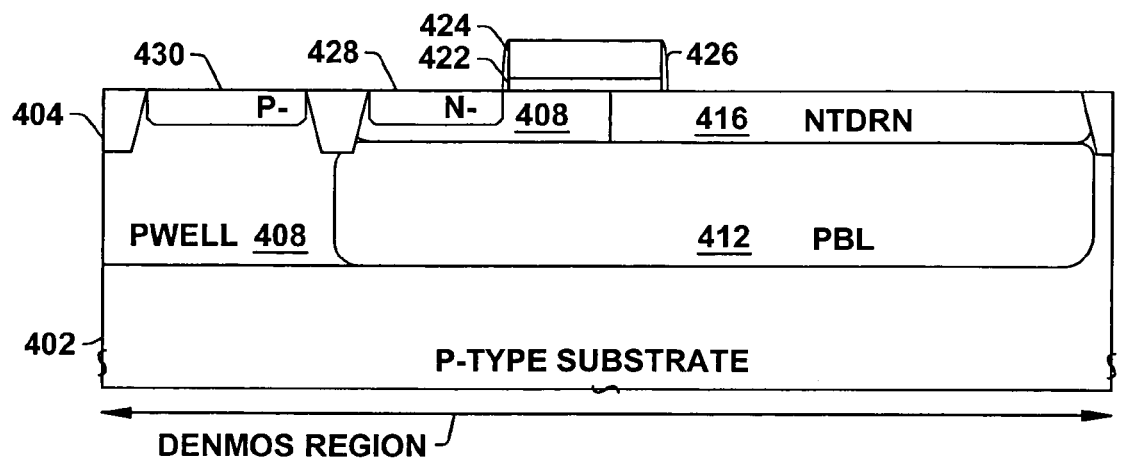
Figure 4L:
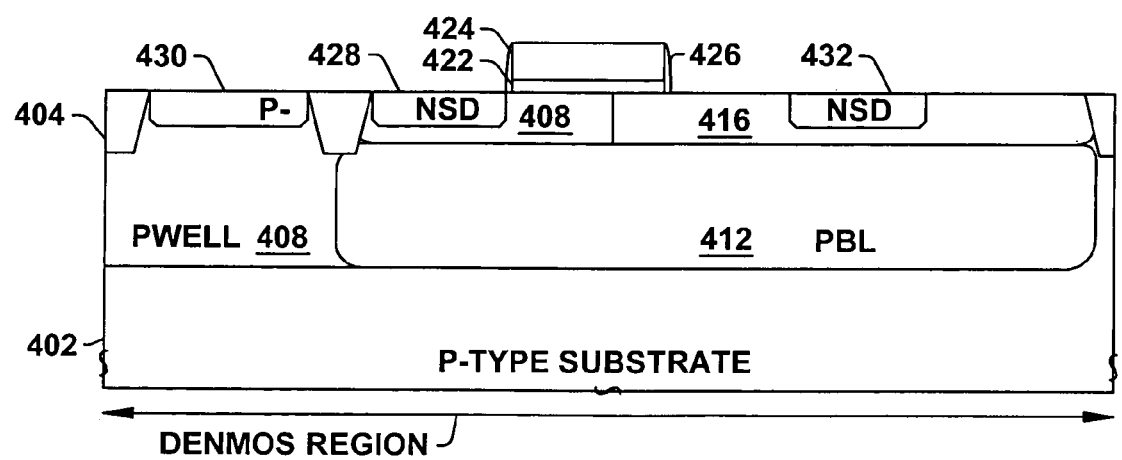
Figure 4M:
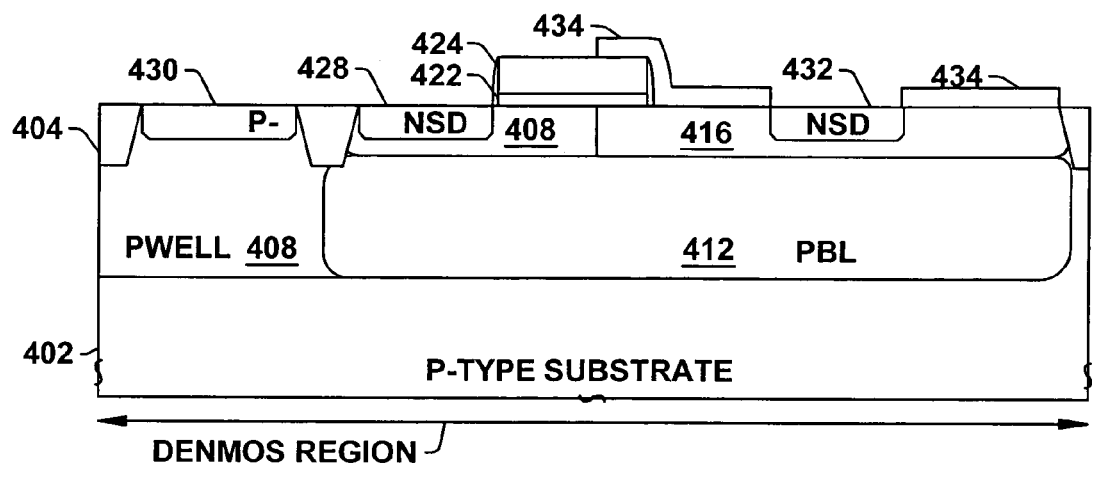
Figure 4N:
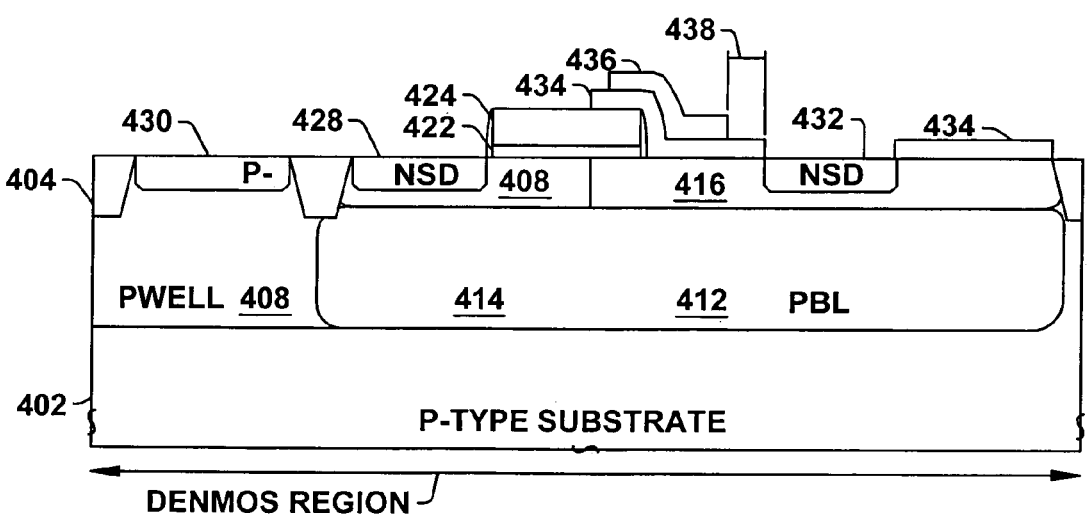
Figure 4O:
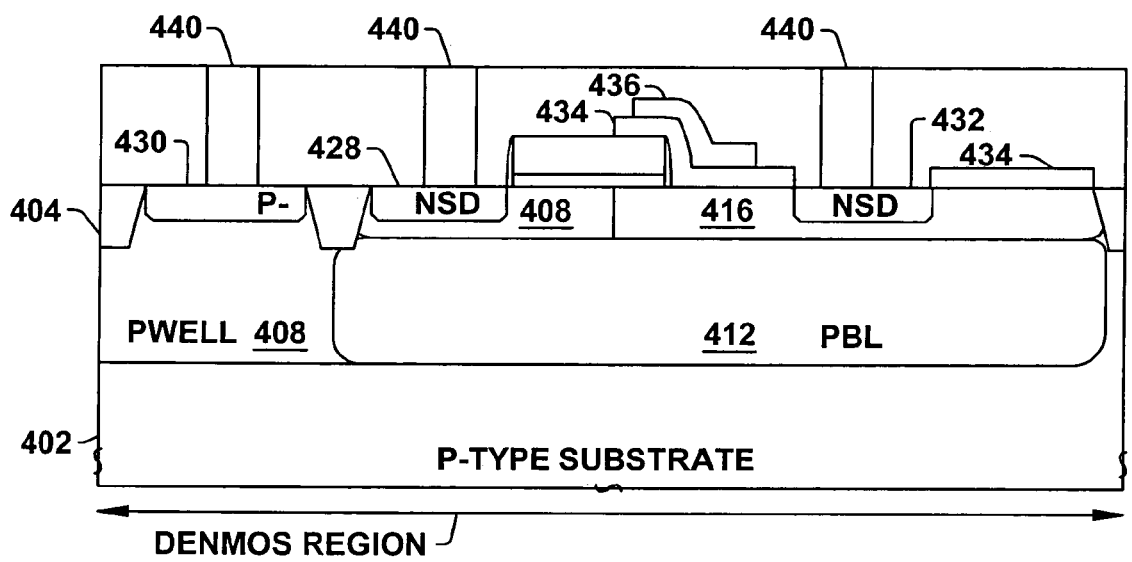
Figure 4P:
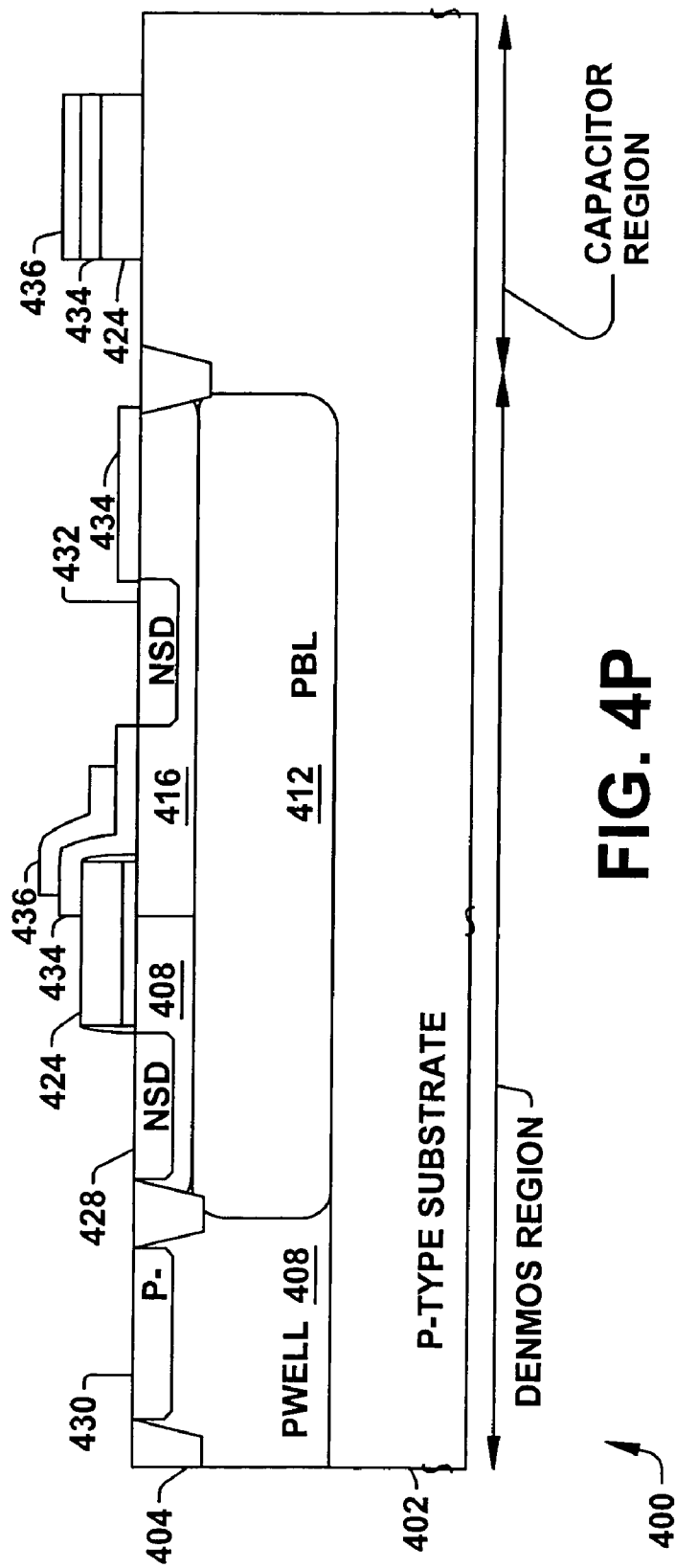

FIGS. 4A to 4P depict various stages of fabrication for a drain extended transistor device 400 with a field plate formed in accordance with the method 300 of FIG. 3. The stages are provided as exemplary structure to facilitate an understanding of the present invention. It is appreciated that the dimensions and/or sizes portrayed in these figures is also exemplary in nature and that actual devices formed in accordance with the present invention can have varied dimensions, sizes, and/or components. It is also noted that the present invention and the method 300 of FIG. 3 includes formation of p-type transistors, although the following figures do not explicitly show their formation.

The device 400 includes a drain extended NMOS region (DENMOS) and a drain extended PMOS region (DEPMOS) wherein n-type and p-type drain extended MOS transistor devices are formed, respectively. Additionally, the device 400 includes a capacitor region wherein poly/metal capacitors are formed.

FIG. 4A is a cross sectional view of a drain extended n-type transistor device 400 at a stage of fabrication in accordance with an aspect of the present invention. A p-doped substrate 402 is provided. The concentration of the p-doped substrate can vary according to implementation. Additionally, the present invention contemplates employing undoped substrates instead of a p-doped substrate. Isolation structures 404 are formed that isolate the transistor device from other devices and define a back gate region on an integrated circuit. The isolation structures can be LOCOS structures, STI structures, or another suitable isolation scheme.

FIG. 4B is a cross sectional view of the drain extended transistor device 400 at another stage of fabrication in accordance with an aspect of the present invention. A layer of resist 406 has been formed over the device 400 for the formation of p-type well regions. The resist layer 406 is developed and/or exposed and a selected portion is removed thereby exposing a target well region within the DENMOS region. Thereafter, p-type dopant(s) are implanted thereby selectively forming p-type well regions 408 in the DENMOS region, as shown in FIG. 4C. Although not shown, n-type well regions are similarly formed within the DEPMOS region.

FIG. 4D is another cross sectional view of the drain extended transistor device 400 at another stage of fabrication in accordance with an aspect of the present invention. A second resist layer 410 is formed over the device for forming buried layers and drain extension regions. The second resist layer 410 is developed and/or exposed to remove selected portions of the resist layer 410 thereby exposing target buried layer/drain extension regions within the DENMOS region.

A p-type buried layer 412 is then formed within the exposed regions by implanting p-type dopant(s) with a relatively low dose and high energy, which is shown in FIG. 4E. This implant is also referred to as a deep implant and is performed as a high energy implant. The formation of the buried layer 412 can be omitted in alternate aspects of the invention.

A drain extension region 416 is subsequently formed by implanting n-type dopant(s) as shown in FIG. 4E. A separate mask (not shown) can be employed to form the drain extension regions by exposing targeted drain extension regions and covering other areas of the device 400.

FIG. 4F is yet another cross sectional view of the drain extended transistor device 400 at another stage of fabrication in accordance with an aspect of the present invention. A VTN2 resist mask 420 is formed over the device that exposes the DEPMOS region but covers the DENMOS region. A VTN2 implant is performed to adjust the threshold voltage of devices within the DEPMOS region. The VTN2 implant is a p-type implant that at least partially forms drains in the DEPMOS region. Thereafter, the VTN2 resist mask 420 is removed.

FIG. 4G is yet another cross sectional view of the drain extended transistor device 400 at another stage of fabrication in accordance with an aspect of the present invention. A gate dielectric layer 422 is formed over the device 400 in both the DEPMOS and DENMOS regions. Typically, the gate dielectric layer 422 is formed by growing silicon dioxide. Subsequently, a gate electrode layer 424 is formed on the gate dielectric layer 422 as shown in FIG. 4H. The gate electrode layer 424 is comprised of a suitable conductive material, such as polysilicon or metal. An n-type implant is performed that causes the gate electrode layer 424 to become n-type. The implant is performed with a dose and energy to obtain a desired n-type dopant concentration of the gate electrode layer 424. A gate formation mask (not shown) is then formed over the device that exposes targeted gate structure regions. The gate electrode layer 424 and the gate dielectric layer 422 are then patterned via the gate formation mask to form gate structures comprised of the gate electrode layer 424 and the gate dielectric layer 422.

FIG. 4L is another cross sectional view of the drain extended transistor device 400 at another stage of fabrication in accordance with an aspect of the present invention. After formation of the gate structures, sidewall spacers 426 are formed on lateral edges of the gate structures. The sidewall spacers 426 can be formed by conformally depositing or forming a dielectric/insulative material, such as silicon dioxide and/or silicon nitride, over the device followed by an anisotropic etch. It is noted that the sidewall spacers 426 can be comprised of individual sidewall spacers comprised of varied materials.

FIG. 4J is yet another cross sectional view of the drain extended transistor device 400 at another stage of fabrication in accordance with an aspect of the present invention. An n-type pocket implant is performed that forms an n-type region 428 within the DENMOS region by implanting n-type dopant(s) with a relatively high dose. A p-type pocket implant is also performed that forms a p-type pocket region 430 as shown in FIG. 4K. The p-type pocket implant also forms p-type pocket regions near target source regions within the DEPMOS region.

FIG. 4L is another cross sectional view of the drain extended transistor device 400 at another stage of fabrication in accordance with an aspect of the present invention. A source/drain implant is performed that forms source regions 428 and drain regions 422 within the DENMOS region. The source/drain implant is performed with one or more n-type dopants at a relatively low energy, so that the formed regions are relatively shallow. Additionally, the source/drain implant is performed with a relatively high dose to obtain a desired concentration within the source region 428 and the drain region 432. Although not shown, a p-type source/drain implant is performed that forms source and drain regions within the DEPMOS region. The p-type source/drain implant is similarly performed with a relatively high dose and low energy in order to obtain a desired concentration and depth for the source/drain regions.

FIG. 4M is yet another cross sectional view of the drain extended transistor device 400 at another stage of fabrication in accordance with an aspect of the present invention. A blocking layer 434 is selectively formed over the device 400. The blocking layer 434 is generally formed over the drain extension region 416 and covers a portion of the gate structure, however the blocking layer 434 does not cover the drain region 432 within the DENMOS region. The blocking layer 434 is also similarly formed within the DEPMOS region.

The blocking layer 434 serves a number of purposes. The blocking layer 434 prevents subsequent silicide formation on the drain extension region 416 in between the drain region 432 and the gate structure. Additionally, the blocking layer 434 serves as a dielectric material in capacitor formation. Furthermore, the blocking layer 434 facilitates formation of subsequently formed field plates, which mitigate increased electric fields around drain corner regions.

FIG. 4N is another cross sectional view of the drain extended transistor device 400 at another stage of fabrication in accordance with an aspect of the present invention. A field plate 436 is formed over/on a portion of the blocking layer 434. The field plate 436 is formed simultaneously to formation of capacitors elsewhere on the device and, as a result, does not require an additional step. The field plate 436 is shown formed in the DENMOS region, but it is also formed similarly in the DEPMOS region.

The field plate 436 is formed a distance 438 from the drain region 432. The varying and/or selection of this distance 438 depends upon desired device performance and reliability.

FIG. 4O is yet another cross sectional view of the drain extended transistor device 400 at another stage of fabrication in accordance with an aspect of the present invention. This view shows formation of contacts 440 in a interlayer dielectric layer or premetal dielectric layer 442. The layer 442 is formed by depositing a suitable dielectric material over the device and optionally planarizing the device to form a relatively planar top surface. Subsequently, contact holes are etched into the layer 442 and ont the source region 428, the drain region 432, and the back gate region 430. Optionally, a contact hole may be etched to the gate electrode layer 424 of the gate structures. Subsequently the contact holes are filled with a suitable conductive material, such as Tungsten.

FIG. 4P is another cross sectional view of the drain extended transistor device 400 at another stage of fabrication in accordance with an aspect of the present invention that include the capacitor region. The contacts 440 and the layer 442 have been removed to further illustrate the device 400. A capacitor structure is shown formed in a capacitor region and comprises the gate electrode layer 424, as a bottom capacitor plate, the blocking layer 434, as a capacitor dielectric layer, and the field plate 436, as a top capacitor plate within the capacitor region.

It is appreciated that the above figures, FIGS. 4A to 4P are exemplary in nature and are provided to facilitate understanding of the present invention. It is appreciated that other suitable devices can be fabricated in accordance with the present invention having different regions and structures Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a drain extended semiconductor device comprising:

forming isolation structures on a semiconductor substrate;

forming n-well regions within a DEPMOS region and p-well regions within an DENMOS region;

forming a gate dielectric layer over the device;

forming a gate electrode layer on the gate dielectric layer;

patterning the gate dielectric layer and the gate electrode layer to form gate structures;

forming n-type drain extension regions within the p-well regions;

forming p-type drain extension regions within the n-well regions;

forming n-type source regions within the p-well regions and n-type drain regions within the n-type drain extension regions;

forming p-type source regions within the n-well regions and p-type drain regions within the p-type drain extension regions;

forming a blocking layer over the n-type and p-type drain extension regions and a portion of the gate structures;

forming a capacitor plate over the semiconductor substrate outside of the DENMOS and DEPMOS regions; and forming field plates over the blocking layer over a portion of the gate structures and the n-type drain extension regions within the DENMOS region and over a portion of the gate structures and the p-type drain extension regions within the DEPMOS region, wherein the field plates are formed simultaneously with forming the capacitor plate.

2. The method of claim 1, further comprising implanting an n-type dopant into the gate electrode layer within the DENMOS region prior to patterning the gate dielectric layer and the gate electrode layer.

3. The method of claim 1, further comprising forming p-type back gate regions within the p-well regions and forming n-type back gate regions within the n-well regions.

4. The method of claim 3, further comprising forming silicide regions on the p-type back gate regions, the n-type back grate regions, the p-type source regions, the n-type source regions, the p-type drain regions, and the n-type drain regions.

5. The method of claim 4, further comprising forming contacts to the silicide regions.

6. The method of claim 1, wherein forming the gate electrode layer comprises forming polysilicon.

7. The method of claim 6, wherein forming the field plates and the capacitor plate comprises depositing metal.

8. The method of claim 1, wherein the semiconductor substrate comprises p-type silicon.

9. A method of fabricating a drain extended semiconductor device comprising:

forming isolation structures on a semiconductor substrate;

forming n-well regions within a DEPMOS region and p-well regions within an DENMOS region;

forming a gate dielectric layer over the device;

forming a gate electrode layer on the gate dielectric layer;

patterning the gate dielectric layer and the gate electrode layer to form gate structures;

forming n-type drain extension regions within the p-well regions;

forming p-type drain extension regions within the n-well regions;

forming n-type source regions within the p-well regions and n-type drain regions within the n-type drain extension regions;

forming p-type source regions within the n-well regions and p-type drain regions within the p-type drain extension regions;

forming p-type back gate regions within the p-well regions and forming n-type back gate regions within the n-well regions;

forming a blocking layer over the n-type and p-type drain extension regions and a portion of the gate structures;

forming a capacitor plate over the semiconductor substrate outside of the DENMOS and DEPMOS regions; and forming field plates over the blocking layer over a portion of the gate structures and the n-type drain extension regions within the DENMOS region and over a portion of the gate structures and the p-type drain extension regions within the DEPMOS region, wherein the field plates are formed simultaneously with forming the capacitor plate.

10. The method of claim 9, wherein the gate dielectric layer is formed by growing silicon dioxide.

11. The method of claim 9, wherein forming the field plates and the capacitor plate comprises forming TaN.

12. The method of claim 9, wherein forming the blocking layer comprises depositing silicon dioxide via a high density plasma deposition process.

* * * * *